(12) United States Patent
Lee

(10) Patent No.: US 10,990,205 B2
(45) Date of Patent: Apr. 27, 2021

(54) DISPLAY DEVICE AND METHOD FOR MANUFACTURING DISPLAY DEVICE

(71) Applicant: Samsung Display Co., Ltd., Yongin-Si (KR)

(72) Inventor: Choon Hyop Lee, Anyang-si (KR)

(73) Assignee: Samsung Display Co., Ltd.

( * ) Notice: Subject to any disclaimer, the term of this patent is extended or adjusted under 35 U.S.C. 154(b) by 19 days.

(21) Appl. No.: 16/659,504

(22) Filed: Oct. 21, 2019

(65) Prior Publication Data
US 2020/0150790 A1  May 14, 2020

(30) Foreign Application Priority Data

Nov. 9, 2018  (KR) .................. 10-2018-0137409

(51) Int. Cl.
*G06F 3/041* (2006.01)
*H01L 27/32* (2006.01)
*G06F 3/02* (2006.01)
*G01L 5/22* (2006.01)

(52) U.S. Cl.
CPC .............. *G06F 3/041* (2013.01); *G01L 5/22* (2013.01); *G06F 3/0202* (2013.01); *H01L 27/323* (2013.01); *H01L 27/3272* (2013.01); *G06F 2203/04103* (2013.01)

(58) Field of Classification Search
CPC ............... G06F 3/041; G06F 3/0202; G06F 2203/04103; G01L 5/22; H01L 27/323; H01L 27/3272
See application file for complete search history.

(56) References Cited

U.S. PATENT DOCUMENTS

| 10,698,538 | B2 * | 6/2020 | Chen | .................. | G06F 3/0446 |
| 2013/0050126 | A1 * | 2/2013 | Kimura | ................. | G06F 3/0487 |
| | | | | | 345/173 |
| 2017/0202605 | A1 * | 7/2017 | Shelton, IV | ....... | H01M 10/425 |
| 2018/0326456 | A1 * | 11/2018 | Park | .................... | G06F 3/0412 |
| 2018/0328799 | A1 * | 11/2018 | Park | .................... | G06F 3/04164 |
| 2019/0138127 | A1 * | 5/2019 | Seo | ..................... | H04M 1/0266 |
| 2020/0042125 | A1 * | 2/2020 | Lee | ..................... | G06F 3/0412 |

FOREIGN PATENT DOCUMENTS

| KR | 10-2017-0033618 A | 3/2017 |
| KR | 10-1792525 B1 | 11/2017 |

\* cited by examiner

*Primary Examiner* — Ricardo Osorio
(74) *Attorney, Agent, or Firm* — Innovation Counsel LLP

(57) ABSTRACT

A display device includes a display panel having a display area and a non-display, an input sensing unit overlapping the display panel, a cover window overlapping the input sensing unit, a first electrode overlapping the non-display area and disposed between the cover window and the input sensing unit, a second electrode disposed between the cover window and the first electrode, a pressure-sensitive member disposed between the first electrode and the second electrode, and a first spacer and a second spacer both disposed between the first electrode and the second electrode. A first minimum thickness of the pressure-sensitive member corresponds to the first spacer. A second minimum thickness of the pressure-sensitive member corresponds to the second spacer and is unequal to the first minimum thickness of the pressure-sensitive member.

20 Claims, 17 Drawing Sheets

DISPLAY DEVICE AND METHOD FOR MANUFACTURING DISPLAY DEVICE

This application claims priority to Korean Patent Application No. 10-2018-0137409 filed on Nov. 9, 2018 in the Korean Intellectual Property Office; the disclosure of the Korean Patent Application is incorporated herein by reference in its entirety.

BACKGROUND

1. Field

The technical field relates to a display device and a method for manufacturing a display device.

2. Description of the Related Art

Display devices may be included in various electronic devices. Modern display devices include, for example, liquid-crystal display (LCD) devices and organic light-emitting diode display (OLED) devices.

A display device may include a display area in which images are displayed and may include a non-display area outside the display area.

SUMMARY

Embodiments may be related to a display device including a pressure key capable of recognizing pressure at multiple levels.

Embodiments may be related to a display device including a pressure key instead of one or more mechanical buttons. An embodiment of a display device includes a display panel comprising a display area and a non-display area disposed on an outer side of the display area, an input sensing unit disposed on the display panel, a cover window disposed on the input sensing unit, and a first pressure key disposed between the cover window and the input sensing unit and comprising a first area and a second area separated from the first area, wherein the first pressure key comprises a first electrode, a second electrode opposed to the first electrode, a pressure-sensitive material disposed between the first electrode and the second electrode, a first spacer disposed in the first area, and a second spacer disposed in the second area, wherein a first minimum height of the pressure-sensitive material is defined in the first area, and a second minimum height of the pressure-sensitive material is defined in the second area, and wherein the first minimum height is different from the second minimum height. An embodiment of a method for manufacturing a display device includes preparing a panel assembly and a cover window facing the panel assembly forming a first pressure key comprising a first area and a second area separated from the first area between the panel assembly and the cover window, and attaching the panel assembly and the cover window together, wherein the first pressure key comprises a first electrode, a second electrode opposed to the first electrode, a pressure-sensitive material disposed between the first electrode and the second electrode, a first spacer disposed in the first area, and a second spacer disposed in the second area, wherein a first minimum height of the pressure-sensitive material is defined in the first area, and a second minimum height of the pressure-sensitive material is defined in the second area, and wherein the first minimum height is different from the second minimum height.

An embodiment may be related to a display device. The display device may include a display panel having a display area and a non-display area neighboring each other in a first direction, an input sensing unit overlapping the display panel, a cover window overlapping the input sensing unit, a first electrode overlapping the non-display area and disposed between the cover window and the input sensing unit in a second direction different from the first direction, a second electrode overlapping the first electrode and disposed between the cover window and the first electrode, a pressure-sensitive member disposed between the first electrode and the second electrode, a first spacer disposed between the first electrode and the second electrode, and a second spacer disposed between the first electrode and the second electrode. The first spacer and the second spacer may neighbor each other in the first direction. A first minimum thickness of the pressure-sensitive member in the second direction may correspond to and/or depend on the first spacer. A second minimum thickness of the pressure-sensitive member in the second direction may correspond to and/or depend on the second spacer. The first minimum thickness of the pressure-sensitive member may be unequal to the second minimum thickness of the pressure-sensitive member.

The first minimum thickness of the pressure-sensitive member may be positioned closer to the display area than the second minimum thickness of the pressure-sensitive member and may be smaller than the second minimum thickness of the pressure-sensitive member.

The display device may include a light-blocking layer disposed between the cover window and the second electrode. The light-blocking layer may include a first constituent light-blocking layer overlapping the first spacer and may include a second constituent light-blocking layer overlapping the second spacer. A thickness of the first constituent light-blocking layer in the second direction may be unequal to a thickness of the second constituent light-blocking layer in the second direction.

The second electrode may include a first sub-electrode disposed on the first constituent light-blocking layer and may include a second sub-electrode disposed on the second constituent light-blocking layer. A distance from the first sub-electrode to the display panel may be unequal to a distance from the second sub-electrode to the display panel.

A thickness of the first spacer in the second direction may be unequal to a thickness of the second spacer in the second direction.

The second electrode may include a first sub-electrode overlapping the first spacer and may include a second sub-electrode overlapping the second spacer. A thickness of the first sub-electrode in the second direction may be different from a thickness of the second sub-electrode in the second direction.

The first electrode may include a first sub-electrode overlapping the first spacer and may include a second sub-electrode overlapping the second spacer. A height of the first sub-electrode with reference to the display panel may be unequal to a height of the second sub-electrode with reference to the display panel.

The first spacer and the second spacer may directly contact the second electrode and may protrude toward the first electrode.

The first spacer and the second spacer may directly contact the first electrode and may be spaced from the second electrode.

The pressure-sensitive member may include a plurality of conductive particles.

The display device may include a ground electrode disposed on the input sensing unit.

The ground electrode may be electrically connected to the first electrode.

The ground electrode may be integral with the first electrode and may be made of a same material as the first electrode.

The display device may include a touch printed circuit board electrically connected to the input sensing unit and may include a touch integrated circuit disposed on the touch printed circuit board. The second electrode may be electrically connected to the touch integrated circuit.

The display device may include a pressure printed circuit board electrically connected to the second electrode. The second electrode may be connected to the touch integrated circuit through the pressure printed circuit board and the touch printed circuit board.

The display device may include a home key disposed on the cover window for receiving a user input. The display area may be disposed between the pressure-sensitive member and the home key.

The cover window may include a flat portion and a bent portion connected to at least one side of the flat portion. The pressure-sensitive member overlaps the bent portion.

The display device may include an outer adhesive layer overlapping the non-display area and disposed farther from the display area than the pressure-sensitive member.

The display device may include an inner adhesive layer. The pressure-sensitive member may be disposed between the inner adhesive layer and the outer adhesive layer.

An embodiment may be related to a method for manufacturing a display device. The method may include the following steps: preparing a panel assembly; preparing a cover window over the panel assembly; providing a first electrode between the cover window and the panel assembly; providing a second electrode between the cover window and the first electrode; providing a pressure-sensitive member between the first electrode and the second electrode; providing a first spacer between the first electrode and the second electrode; and providing a second spacer between the first electrode and the second electrode. The first spacer and the second spacer neighbor each other in a first direction. A second direction may be different from the first direction. A first minimum thickness of the pressure-sensitive member in the second direction may correspond to and/or depend on the first spacer. A second minimum thickness of the pressure-sensitive member in the second direction may correspond to and/or depend on the second spacer. The first minimum of the pressure-sensitive member may be unequal to the second minimum thickness of the pressure-sensitive member. According to an embodiment, a display device may include a pressure key capable of recognizing pressure at multiple levels.

In an embodiment, the pressure key may have satisfactory durability.

DETAILED DESCRIPTION

Example embodiments are described with reference to the accompanying drawings. Embodiments may be implemented in different forms and should not be construed as limited to the described embodiments. Same reference numbers may indicate same or similar components in the specification.

Unless defined otherwise, all technical and scientific terms used herein have the same meaning as commonly understood by one of ordinary skill in the art Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on," "connected to," or "coupled to" a second element, the first element can be directly on, directly connected to, or directly coupled to the second element, or one or more intervening elements may be present between the first element and the second element. When a first element is referred to as being "directly on," "directly connected to," or "directly coupled to" a second element, there are no intended intervening elements (except environmental elements such as air) present between the first element and the second element.

The term "and/or" includes any and all combinations of one or more of the associated items. The term "connect" may mean "electrically connect"; the term "pattern" may mean "member"; the term "pressure-sensitive material" may mean "pressure-sensitive member."

Figure 1:
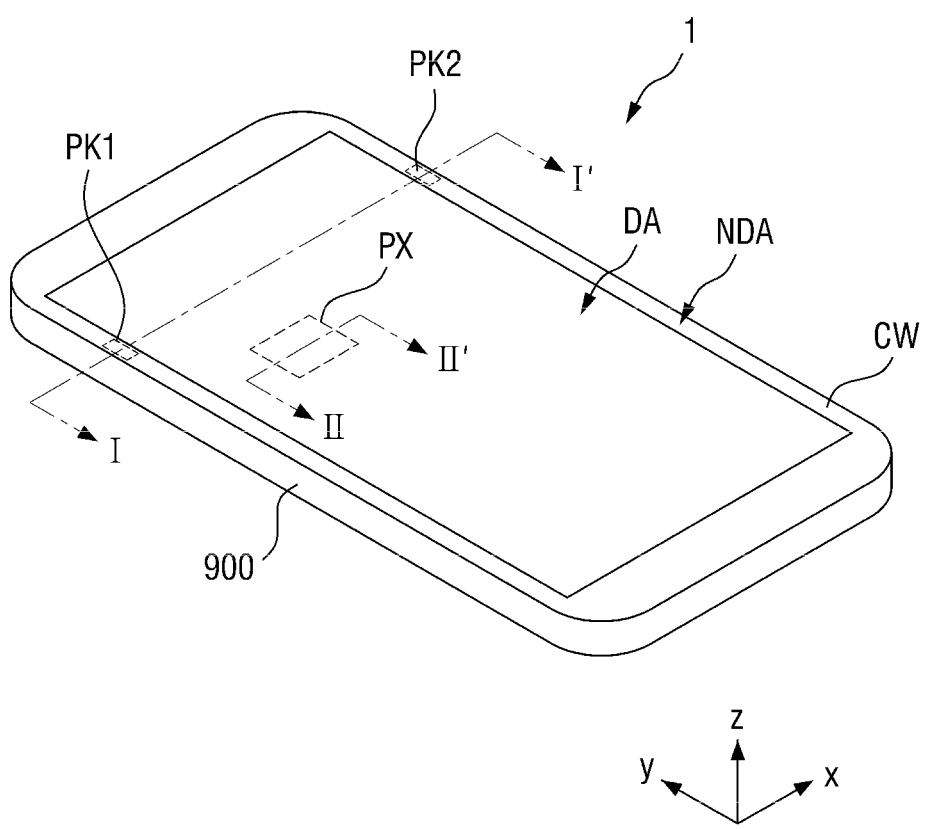
FIG. 1 is a perspective view of a display device according to an embodiment.
Figure 2:
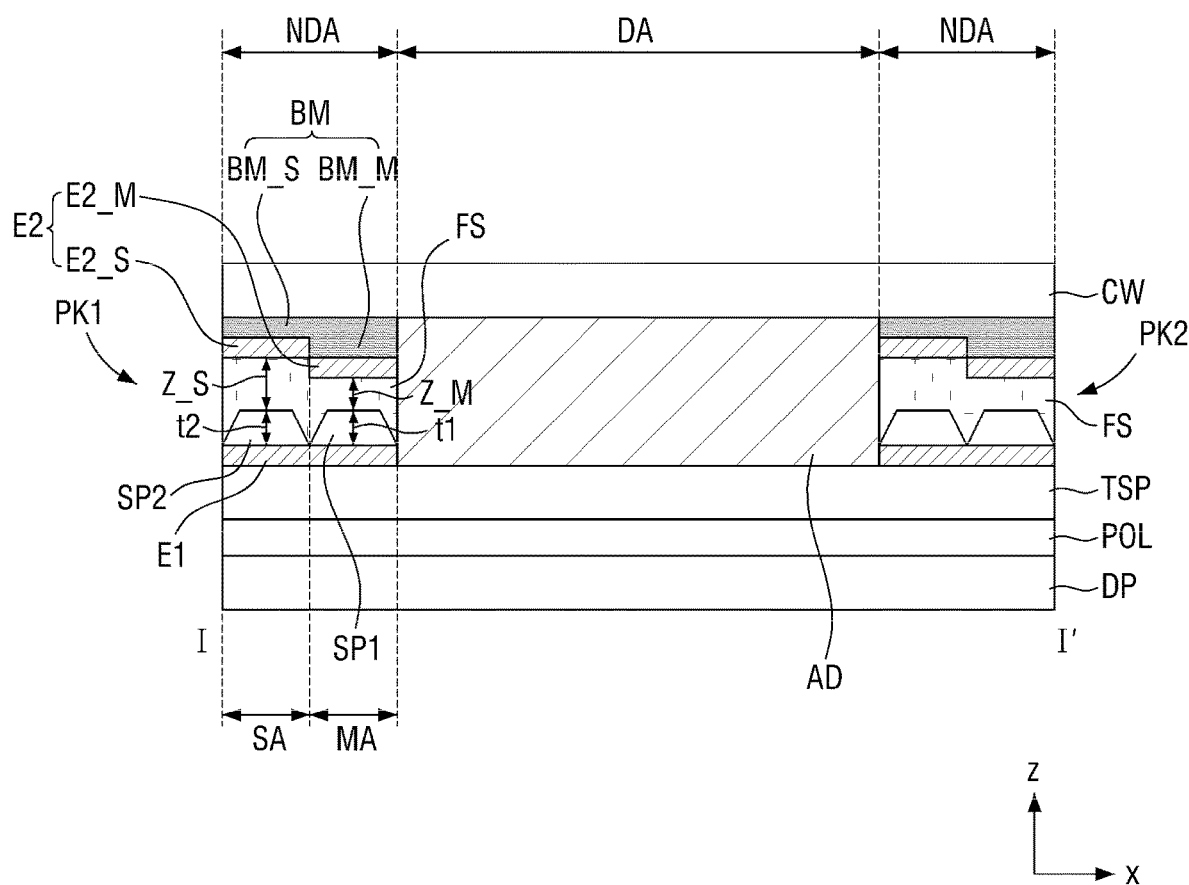
FIG. 2 is a cross-sectional view taken along line I-I' of FIG. 1 according to an embodiment.
Figure 3:
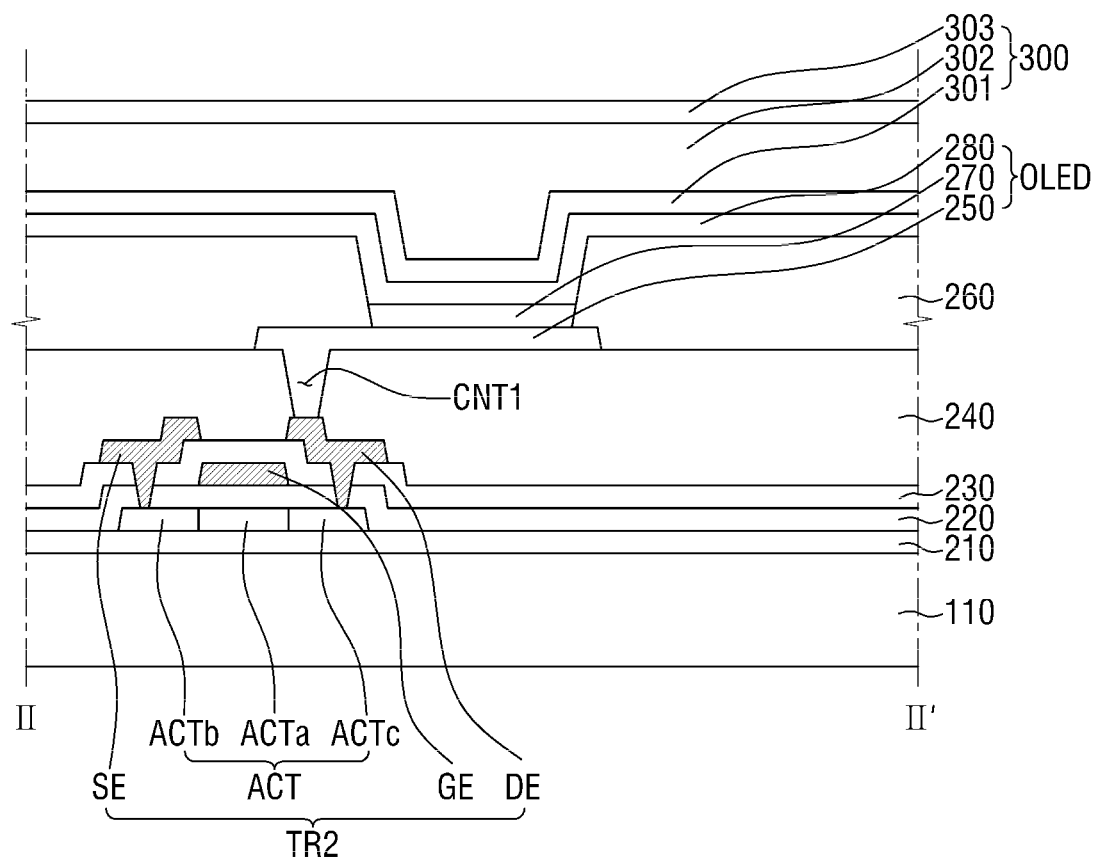
FIG. 3 is a cross-sectional view taken along line II-II' of FIG. 1 according to an embodiment.
Figure 4:
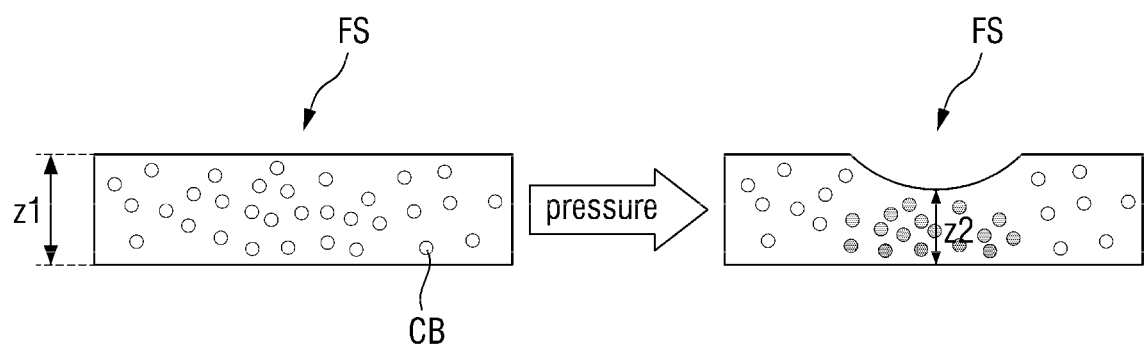
FIG. 4 is a view/diagram illustrating some elements of FIG. 1 according to an embodiment.
Figure 5:
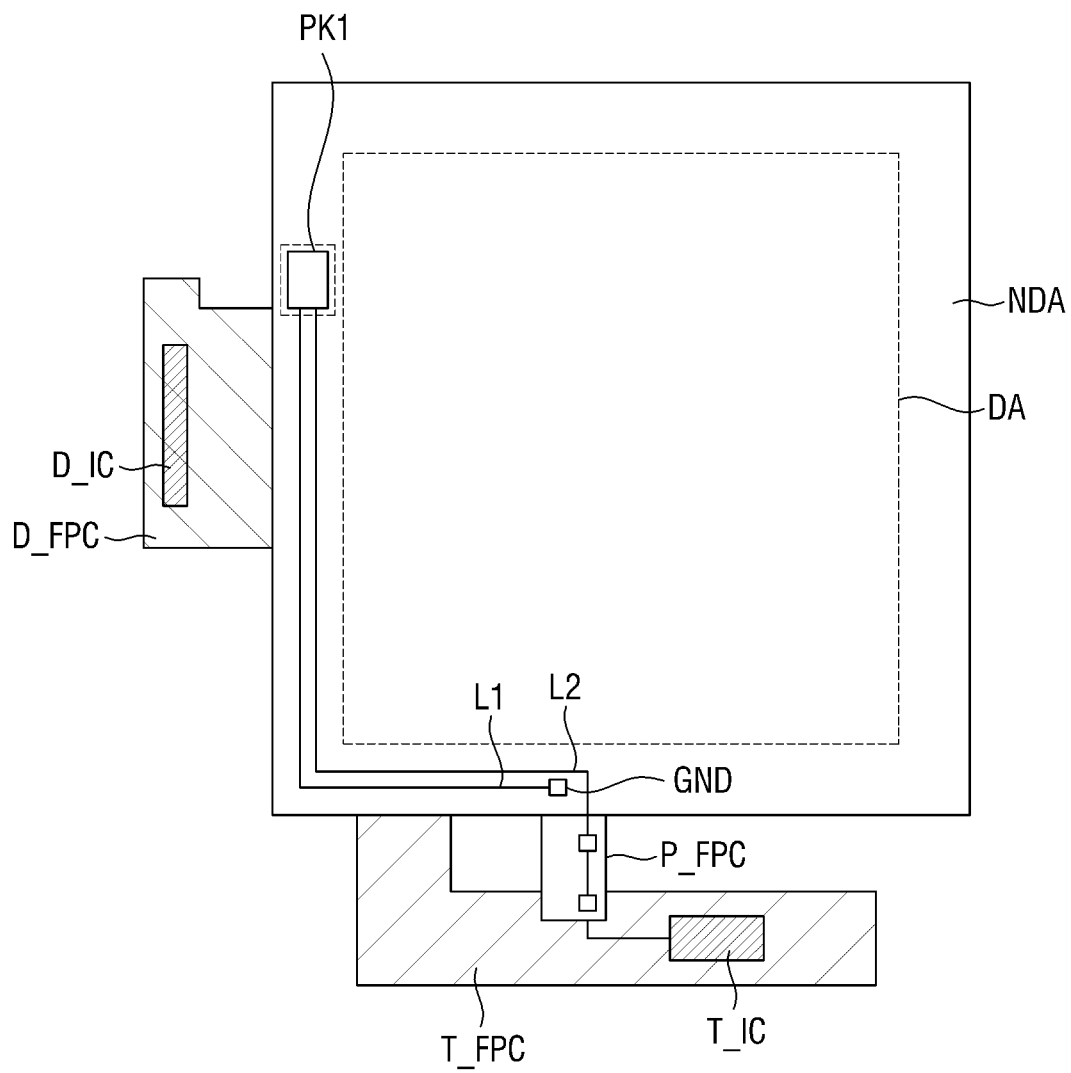
FIG. 5 is a plan view showing a layout of a display device according to an embodiment.

FIG. 1 is a perspective view of a display device according to an embodiment. FIG. 2 is a cross-sectional view taken along line I-I' of FIG. 1 according to an embodiment. FIG. 3 is a cross-sectional view taken along line II-II' of FIG. 1 according to an embodiment. FIG. 4 is a view/diagram illustrating some elements of FIG. 1 according to an embodiment. FIG. 5 is a plan view showing a layout of a display device according to an embodiment.

Referring to FIGS. 1 to 5, a display device 1 includes a display panel DP, an input sensing unit TSP, a cover window CW, and a first pressure key PK1.

The display panel DP may be a panel for displaying images. The display panel DP may be an organic light-emitting display device. In embodiments, the display panel DP may be a liquid-crystal display device or other kinds of display devices.

The display panel DP may include a display area DA and a non-display area NDA.

The display area DA is defined as the area for displaying images. A plurality of pixels PX for presenting images may be disposed in the display area DA.

The non-display area NDA is defined as an area that is disposed outside the display area DA and does not (dynamically) display an image. The non-display area NDA may surround the display area DA, for example.

The display area and the non-display area of the display device may be defined based on the display area DA and the non-display area NDA of the display panel. The display area DA and the non-display area NDA of the display panel DP may correspond to the display area and the non-display area of the display device, respectively.

Tone or more non-display areas NDA may abut one or more sides (e.g., less than four sides) of the display area DA.

An example of a stack structure of a pixel PX is described with reference to FIG. 3.

The display panel DP may include a first substrate 110. The first substrate 110 may include a transparent material such as glass, quartz, and/or a polymeric resin. The polymer material may be/include polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or a combination of some of the above materials.

The buffer layer 210 may be disposed on the first substrate 110. The buffer layer 210 may prevent moisture and oxygen from permeating into the first substrate 110. The buffer layer 210 may provide a flat surface over the first substrate 110. The buffer layer 210 may include one of a silicon nitride (SiNx) layer, a silicon oxide ($SiO_2$) layer, and a silicon oxynitride (SiOxNy) layer. The buffer layer 210 may be unnecessary depending on the type of the first substrate 110, process conditions, etc.

A semiconductor layer including a semiconductor pattern ACT may be disposed on the buffer 210. The semiconductor pattern ACT will be described as an example of the semiconductor layer. The semiconductor pattern ACT may be made of one selected from polycrystalline silicon, single crystal silicon, low-temperature polycrystalline silicon, amorphous silicon and oxide semiconductor, or a mixture. The semiconductor pattern ACT may include a channel region ACTa doped with no impurity, and a source region ACTb and a drain region ACTc doped with impurities. The source region ACTb is located on one side of the channel region ACTa and is electrically connected to a source electrode SE. The drain region ACTc is located on the other side of the channel region ACTa and is electrically connected to a drain electrode DE described later.

The first insulating layer 220 may be disposed on the semiconductor layer including the semiconductor pattern ACT. The first insulating layer 220 may be a gate insulating layer. The first insulating layer 220 may be made of at least one selected from the group consisting of: an inorganic insulating material such as silicon oxide (SiOx) and silicon nitride (SiNx), BCB (BenzoCycloButene), an acryl-based material and an organic insulating material such as polyimide, or a mixture.

A gate conductor including the gate electrode GE may be disposed on the first insulating layer 220. The gate electrode GE may overlap with the semiconductor pattern ACT. For example, the gate conductor may include at least one of an aluminum (Al)-based metal including an aluminum alloy, a silver (Ag)-based metal including a silver alloy, a copper (Cu)-based metal including a copper alloy, a molybdenum (Mo)-based metal including molybdenum alloy, chromium (Cr), titanium (Ti), and tantalum (Ta).

A second insulating layer 230 may be disposed on the gate conductor including the gate electrode GE. The second insulating layer 230 may be made of at least one selected from the group consisting of: an inorganic insulating material such as silicon oxide (SiOx) and silicon nitride (SiNx), BCB (BenzoCycloButene), an acryl-based material and an organic insulating material such as polyimide, or a mixture.

A data conductor including the source electrode SE and the drain electrode DE may be disposed on the second insulating layer 230. The source electrode SE and the drain electrode DE are disposed on the second insulating layer 230 such that they are spaced apart from each other. The data conductor may include at least one selected from the group consisting of: a metal, an alloy, a metal nitride, a conductive metal oxide, and a transparent conductive material. The data conductor may have a single-layer structure or a multi-layers structure made of at least one of nickel (Ni), cobalt (Co), titan (Ti), silver (Ag), copper (Cu), molybdenum (Mo), aluminum (Al), beryllium (Be), niobium (Nb), gold (Au), iron (Fe), selenium (Se), tantalum (Ta), etc. In an embodiment, an alloy formed by adding at least one element selected from the group consisting of titanium (Ti), zirconium (Zr), tungsten (W), tantalum (Ta), niobium (Nb), platinum (Pt), hafnium (Hf), oxygen (O) and nitrogen (N) to the above-listed metal may be used as the materials of the source electrode SE and the drain electrode DE.

The semiconductor pattern ACT, the gate electrode GE, the source electrode SE, and the drain electrode DE described above form a switching element TR2. The switching element TR2 is shown as a top-gate transistor in FIG. 3. In an embodiment, the switching element TR2 may be a bottom-gate transistor.

A planarization layer 240 may be disposed on the data conductor. The planarization layer 240 can increase the luminous efficiency of the pixel electrode 250 and the organic emission layer 270 by removing the level difference. The planarization layer 240 may include an organic material. For example, the planarization layer 240 may include at least one of polyimide, polyacryl, and polysiloxane. In an embodiment, the planarization layer 240 may comprise an inorganic material, or may be a composite of an inorganic material and an organic material. A first contact hole CNT1 may be formed in the planarization layer 240 to expose at least a part of the drain electrode DE.

The pixel electrode 250 may be disposed on the planarization layer 240. The pixel electrode 250 may be electrically connected to the drain electrode DE exposed via the first contact hole CNT1. That is, the pixel electrode 250 may be an anode, which is a hole injection electrode. When the pixel electrode 250 is an anode electrode, the pixel electrode 250 may include a material having a high work function to facilitate hole injection. The pixel electrode 250 may be a reflective electrode, a transflective electrode, or a transmissive electrode. The pixel electrode 250 may include a reflective material. The reflective material may include, for example, at least one of silver (Ag), magnesium (Mg), chromium (Cr), gold (Au), platinum (Pt), nickel (Ni), copper (Cu), tungsten (W), aluminum (Al), aluminum-lithium (Al—Li), magnesium-indium (Mg—In), and magnesium-silver (Mg—Ag).

The pixel electrode 250 may be formed as a single layer or may include multiple layers in which two or more materials are stacked.

The pixel electrode 250 may include, for example, a reflective layer and may include a transparent or translucent electrode disposed on the reflective layer. The pixel electrode 250 may include a reflective layer and may include a transparent or translucent electrode disposed under the reflective layer. For example, the pixel electrode 250 may have a three-layer structure of ITO-Ag-ITO.

The transparent or translucent electrode may be made of at least one of indium tin oxide (ITO), indium zinc oxide (IZO), zinc oxide (ZnO), $In_2O_3$ (Indium Oxide), indium gallium oxide (IGO), and aluminum zinc oxide (AZO).

A pixel defining layer 260 may be disposed on the pixel electrode 250. The pixel defining layer 260 includes an opening via which at least a part of the pixel electrode 250 is exposed. The pixel defining layer 260 may include an organic material or an inorganic material. The pixel defining layer 260 may include at least one of a photoresist, a polyimide resin, an acrylic resin, a silicon compound, and a polyacrylic resin.

The organic emission layer 270 may be disposed on the pixel electrode 250 and the pixel defining layer 260. The organic emission layer 270 may be disposed on the portion of the pixel electrode 250 that is exposed via the opening of the pixel defining layer 260. The organic emission layer 270 may cover at least a part of the sidewall of the pixel defining layer 260.

The organic emission layer 270 may emit one of red, blue, and green colors, for example. In an embodiment, the organic emission layer 270 may emit white light or may emit light of one of cyan, magenta, and yellow. When the organic emission layer 270 emits white light, it may include a white light-emitting material, or may have a stack structure of a red light-emitting layer, a green light-emitting layer, and a blue light-emitting layer to emit white light.

The common electrode 280 may be disposed on the organic emission layer 270 and the pixel defining layer 260. The common electrode 280 may be disposed throughout the organic emission layer 270 and the pixel defining layer 260. The common electrode 280 may be a cathode electrode. The common electrode 280 may include at least one of Li, Ca, LiF/Ca, LiF/Al, Al, Ag, and Mg. In an embodiment, the common electrode 280 may be made of a material having a low work function. The common electrode 280 may be made of at least one of indium tin oxide (ITO), indium zinc oxide (IZO), zinc oxide (ZnO), indium oxide ($In_2O_3$), indium gallium oxide (IGO), and aluminum zinc oxide (AZO).

The above-described pixel electrode 250, organic emission layer 270, and common electrode 280 may constitute an organic light-emitting diode OLED. The organic light-emitting diode OLED may further including a hole injection layer (HIL), a hole transport layer (HTL), an electron transport layer (ETL), and an electron injection layer (EIL).

An encapsulation layer 300 may be disposed on the common electrode 280.

The encapsulation layer 300 may be used to prevent moisture, air, etc. from permeating into the organic light-emitting diode OLED. The encapsulation layer 300 may include a first inorganic layer 301, an organic layer 302, and a second inorganic layer 303.

The first inorganic layer 301 may be disposed on the common electrode 280. The first inorganic layer 301 may include at least one of silicon oxide (SiOx), silicon nitride (SiNx), and silicon oxynitride (SiONx).

The organic layer 302 may be disposed on the first inorganic layer 301. The organic layer 302 may include one of epoxy, acrylate, and urethane acrylate. The organic layer 302 can provide a flat surface over the level difference created by the pixel defining layer 260.

The second inorganic layer 303 may be disposed on the organic layer 302. The second inorganic layer 303 may include at least one of silicon oxide (SiOx), silicon nitride (SiNx), and silicon oxynitride (SiONx).

At least one of the first inorganic layer 301, the organic layer 302, and the second inorganic layer 303 may include multiple layers.

The encapsulation layer 300 may include a hexamethyldisiloxane (HMDSO) layer. More specifically, the encapsulation layer 300 may include the first inorganic layer 301, the second inorganic layer 303, and the HMDSO layer disposed between the first inorganic layer 301 and the second inorganic layer 303. In an embodiment, the above-described organic layer 302 may be replaced with the HMDSO layer.

The HMDSO layer may be formed in the same chamber after forming the first inorganic layer 301. In this manner, the process of forming the encapsulation layer 300 can be simplified. In an embodiment, as the HMDSO layer is capable of absorbing stress, the encapsulation layer 300 can have sufficient flexibility.

The encapsulation layer 300 may be replaced or supplemented with a rigid second substrate (not shown). The second substrate may be attached/connected to the first substrate 110. The space between the first substrate 110 and the second substrate may be sealed to prevent moisture and the like from permeating into the organic light-emitting element.

Referring to FIG. 2, a polarization layer POL may be disposed on the display panel DP. The polarization layer POL can reduce the reflectance of light incident from the outside. The polarization layer POL may include a retarder and a polarizer in an embodiment.

The input sensing unit TSP may be disposed on the polarization layer POL. The input sensing unit TSP may recognize a touch from a user or an external object and may generate a necessary signal in response to the touch.

The input sensing unit TSP is disposed on the polarization layer POL in the example shown in FIG. 2. In an embodiment, the input sensing unit TSP may be formed on the display panel DP, and the polarization layer POL may be formed on the input sensing unit TSP.

The cover window CW may be disposed above the input sensing unit TSP. The cover window CW may be made of glass or plastic. A transparent material can be used for forming the cover window CW according to an embodiment.

The cover window CW may be curved or bent. The cover window CW may have flexibility.

In an embodiment, one or more pressure keys PK1 and PK2 may be disposed between the cover window CW and the input sensing unit TSP.

In the example shown in FIG. 1, two pressure keys are disposed at opposite sides of the display area DA. The two pressure keys are referred to as a first pressure key PK1 and a second pressure key PK2.

In some embodiments, only one pressure key or three or more pressure keys may be implemented in the display device 1.

For illustration, the first pressure key PK1 will be described. The second pressure key PK2 may be substantially identical to or analogous to the first pressure key PK1; therefore, description of the first pressure key PK1 can be substantially applied to the second pressure key PK2.

The first pressure key PK1 may include a first electrode E1, a second electrode E2, a pressure-sensitive material FS, a first spacer SP1, and a second spacer SP2.

The first electrode E1 may be made of a conductive material. The first electrode E1 may be disposed on the input sensing unit TSP. Specifically, the first electrode E1 may overlap the non-display area NDA.

The second electrode E2 may overlap the first electrode E1.

The second electrode E2 may be made of a conductive material. The conductive material may be, for example, a metal. When the conductive material is a metal, each of the thicknesses of the first electrode E1 and the thickness of the second electrode E2 may be in a range from 0.14 µm to 0.16 µm.

The conductive material may be a transparent material, such as indium tin oxide (ITO). When the conductive material is a transparent material, each of the thicknesses of the first electrode E1 and the thickness of the second electrode E2 may be in a range from 0.12 µm to 0.14 µm.

The second electrode E2 may be spaced apart from the first electrode E1.

The display device may further include a light-blocking layer BM disposed between the cover window CW and the second electrode E2. The second electrode E2 may be disposed directly on the light-blocking layer BM, and the light-blocking layer BM may be disposed directly on the cover window CW.

The light-blocking layer BM may block undesirable light leakage. The light-blocking layer BM may include a color pigment. The color pigment may include, for example, a black pigment.

The first pressure key PK1 may include a first area MA and a second area SA that neighbor each other. The first area MA may be a portion of the first pressure key PK1 that is relatively close to the display area DA, and the second area SA may be a portion of the first pressure key PK1 that is relatively far from the display area DA.

Figure 8:
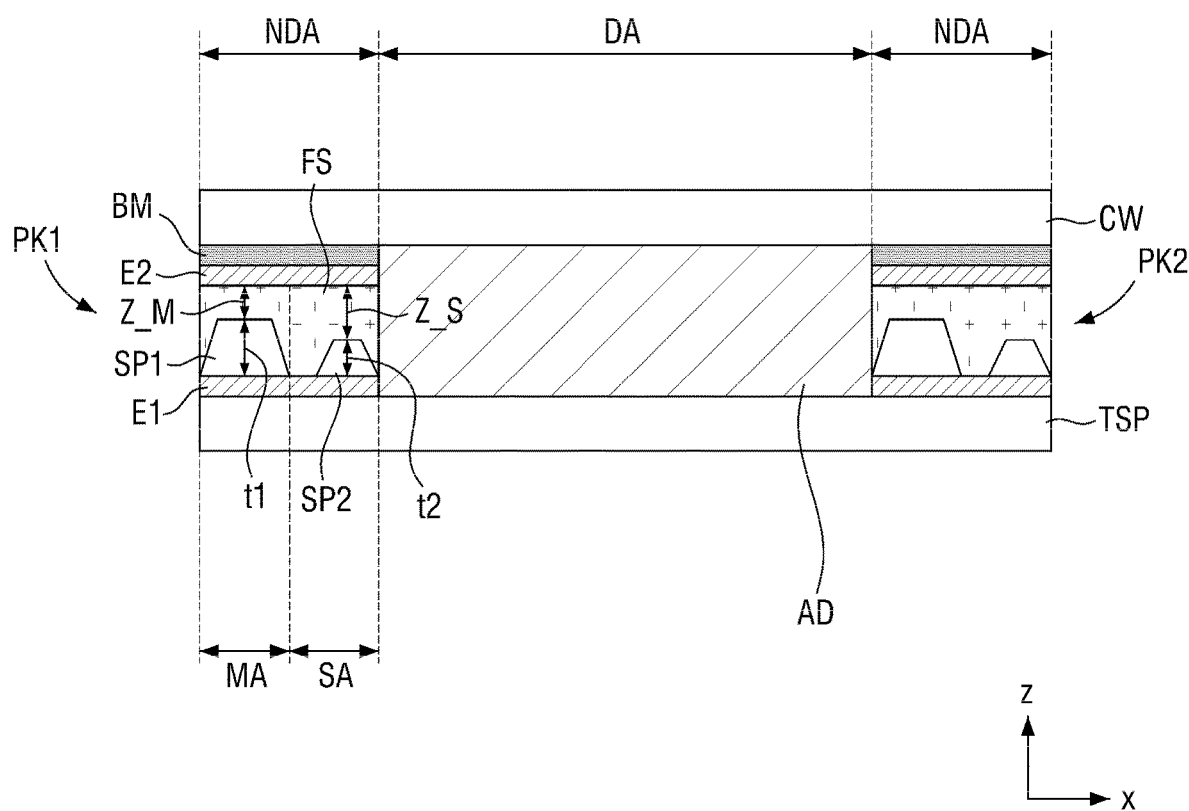
FIG. 8 is a cross-sectional view of a display device according to an embodiment.

The first area MA may be a portion of the first pressure key PK1 that is relatively far from the display area DA, and the second area SA may be a portion of the first pressure key PK1 that is relatively close to the display area DA, as shown in FIG. 8.

The first area MA and the second area SA may refer to the inner portion and the outer portion of the first pressure key PK1 that neighbor each other.

At least one spacer may be disposed between the first electrode E1 and the second electrode E2. A first spacer SP1 may be disposed in the first area MA, and a second spacer SP2 may be disposed in the second area SA.

The first spacer SP1 and the second spacer SP2 may partly occupy the space between the first electrode E1 and the second electrode E2.

The first spacer SP1 and the second spacer SP2 may be formed of an organic material and/or an inorganic material.

The first spacer SP1 and the second spacer SP2 may include a photosensitive material and/or may be formed by a photolithography process.

The first spacer SP1 and the second spacer SP2 may be grown from the first electrode E1 toward the second electrode E2, i.e., in the positive z-axis direction. Each of the first spacer SP1 and the second spacer SP2 may have a tapered cross section. As shown in FIG. 2, each of the first spacer SP1 and the second spacer SP2 may have a trapezoid-shaped cross section.

The first spacer SP1 and the second spacer SP2 may maintain the gap for the pressure-sensitive material FS. Without the spacers SP1 and SP2, if the first pressure key PK1 is subjected to external pressure for a long time and/or for numerous repetitions, the gap for the pressure-sensitive material FS may collapse, such that the sensitivity may be undesirably lowered. The first spacer SP1 and the second spacer SP2 can support the pressure-sensitive material FS to maintain a sufficient gap.

The pressure-sensitive material FS may be disposed between the first electrode E1 and the second electrode E2. The pressure-sensitive material FS may occupy the part of the space between the first electrode E1 and the second electrode E2 not occupied by the first spacer SP1 and the second spacer SP2.

The pressure-sensitive material FS is described with reference to FIG. 4. The pressure-sensitive material FS may have electrical resistance that varies depending on the pressure applied to the pressure-sensitive material FS. The electrical resistance of the pressure-sensitive material FS may vary depending on the length/thickness in the z-axis direction. Referring to FIG. 4, when the pressure-sensitive material FS is pressed, the length/thickness of the pressure-sensitive material FS in the z-axis direction may decrease from a first length z1 to a second length z2. The electrical conductivity of the pressure-sensitive material FS when the pressure-sensitive material FS has the second length z2 may be larger than the electrical conductivity of the pressure-sensitive material FS when the pressure-sensitive material FS has the first length z1.

Since the pressure-sensitive material FS changes electrical resistance depending on received pressure, the pressure-sensitive material FS can be utilized in a pressure sensor that senses an external pressure.

The pressure-sensitive material FS may include a plurality of conductive particles CB. When the pressure-sensitive material FS is pressed, the density of the conductive particles CB in a region changes, and the change in the density of the conductive particles CB may result in a change in the resistance in the region.

The pressure-sensitive material FS may be made of a material including one of a conductive rubber using carbon black as conductive particles, a quantum tunneling composite (QTC), and a pressure-sensitive resistance ink having a resistance varying depending on the applied pressure.

The minimum height of the pressure-sensitive material FS may be the minimum length/thickness of the pressure-sensitive material FS in the z axis direction between the first electrode E1 and the second electrode E2.

The minimum height of the pressure-sensitive material FS in the first area MA may be unequal to that of the second area SA.

The pressure-sensitive material FS may have a first minimum height Z_M in the first area MA and a second minimum height Z_S in the second area SA.

The first minimum height Z_M may be a minimum distance between the top surface of the first spacer SP1 and the second electrode E2.

The second minimum height Z_S may be a minimum distance between the top surface of the second spacer SP2 and the second electrode E2.

The first minimum height Z_M and the second minimum height Z_S may be unequal to each other.

As described above, the resistance of the pressure-sensitive material FS may vary depending on the length/thickness in the z-axis direction.

As the first minimum height Z_M is unequal to and the second minimum height Z_S, the first pressure key PK1 can recognize different degrees of pressure. In other words, the first pressure key PK1 can sense pressures at multiple levels. As the first pressure key PK1 senses pressures at multiple levels, it can provide a signal associated with each of the levels in the display device 1, in response to a variety of types of inputs.

Referring to FIG. 2, the light-blocking layer BM may include a first constituent light-blocking layer BM_M disposed in the first area MA and may include a second constituent light-blocking layer BM_S disposed in the second area SA.

The heights of the first constituent light-blocking layer BM_M and the second constituent light-blocking layer BM_S may be unequal to each other. The first constituent light-blocking layer BM_M may be thicker than the second constituent light-blocking layer BM_S. This can be achieved by printing the light-blocking layer BM for different numbers of times between the first area MA and the second area SA. The first constituent light-blocking layer BM_M may be formed by printing it twice, while the second constituent light-blocking layer BM_S may be formed by printing it once. The thickness of the first light-blocking layer BM_M may be in a range from 6 μm to 10 μm, and the thickness of the second light-blocking layer BM_S may be in a range from 3 μm to 5 μm.

As the first constituent light-blocking layer BM_M and the second constituent light-blocking layer BM_S have different thicknesses, the second electrode E2 may have multiple heights. The second electrode E2 may include a first sub-electrode E2_M disposed in the first area MA and may include a second sub-electrode E2_S disposed in the second area SA.

The first sub-electrode E2_M may be formed on the first constituent light-blocking layer BM_M, and the second sub-electrode E2_S may be formed on the second constituent light-blocking layer BM_S. As the thicknesses of the first constituent light-blocking layer BM_M is unequal to the thickness of the second constituent light-blocking layer BM_S, the first sub-electrode E2_M and the second sub-electrode E2_S disposed may have different levels with reference to the display panel DP. The expression "two elements have different levels" may refer to "the two elements are disposed on planes having different heights."

Referring to FIG. 2, the first thickness t1 of the first spacer SP1 may be substantially equal to the thickness of the second thickness t2 of the second spacer SP2. Parts of the first electrode E1 may be disposed on the same plane.

The difference between the first minimum height Z_M and the second minimum height Z_S may result from the difference in heights of the light-blocking layer BM disposed in the first area MA and the second area SA.

Referring back to FIG. 1, the cover window CW may be fastened to a case 900. The case 900 may provide a space for accommodating the above-described elements. For illustration, the case 900 is shown as a single piece in FIG. 1. The case 900 may be a combination of a plurality of components.

Referring back to FIG. 2, an adhesive layer AD may be disposed between the cover window CW and the input sensing unit TSP. The adhesive layer AD has optical transparency and can couple the cover window CW with the input sensing unit TSP. The adhesive layer AD may entirely overlap with the display area DA in the example shown in FIG. 2. The adhesive layer AD may partially overlap the display area DA. The first pressure key PK1 and the second pressure key PK2 may directly contact with the adhesive layer AD in the example shown in FIG. 2. The first pressure key PK1 and the second pressure key PK2 may be spaced apart from the adhesive layer AD.

Referring to FIG. 5, the display device may further include a first (conductive) line L1 and a second (conductive) line L2.

The first line L1 may be electrically connected to the first electrode E1. One end of the first line L1 may be connected to the first electrode E1. The other end of the first line L1 may be connected to the ground and/or may be connected to a ground electrode GND.

The ground electrode GND and the first electrode E1 may be made of the same material. The ground electrode GND and the first electrode E1 may be formed via the same process step(s).

The ground electrode GND may be connected to the first electrode E1 through the first line L1.

The ground electrode GND and the first electrode E1 may be integrally formed.

The ground electrode GND disposed on the input sensing unit TSP may block noise caused by the input sensing unit TSP and/or caused by a plurality of electrodes disposed on the display panel DP.

By electrically connecting the ground electrode GND with the first electrode E1, by forming the ground electrode GND integrally with the first electrode E1, and/or by using the ground electrode GND as the first electrode E1, it is possible to form the pressure key without additional elements, and thus the thickness of the display device can be minimized.

The display device may include a driving printed circuit board D_FPC, a touch printed circuit board T_FPC, and a pressure printed circuit board P_FPC.

The driving printed circuit board D_FPC may be connected to the display panel DP to provide a signal necessary for driving the display panel DP.

The driving printed circuit board D_FPC may include a driving integrated circuit D_IC, which generates a signal necessary for driving the display panel DP.

The touch printed circuit board T_FPC may be connected to the input sensing unit TSP to provide a signal necessary for driving the input sensing unit TSP.

The touch printed circuit board T_FPC may include a touch integrated circuit T_IC, which generates a signal necessary for driving the input sensing unit TSP.

The second electrode E2 may be electrically connected to the touch integrated circuit T_IC. The pressure sensed by the first pressure key PK1 and/or the second pressure key PK2 may be converted into a signal, and the signal may be provided to the touch integrated circuit T_IC.

The second electrode E2 may be electrically connected to an end of the second line L2. The other end of the second line L2 may be electrically connected to the pressure printed circuit board P_FPC. The pressure printed circuit board P_FPC may be electrically connected to the touch printed circuit board T_FPC. The pressure printed circuit board P_FPC and the touch printed circuit board T_FPC may be formed integrally.

The second electrode E2 may be electrically connected to the touch integrated circuit T_IC formed on the touch printed circuit board T_FPC via the second line L2 and the pressure printed circuit board P_FPC.

Figure 6A:
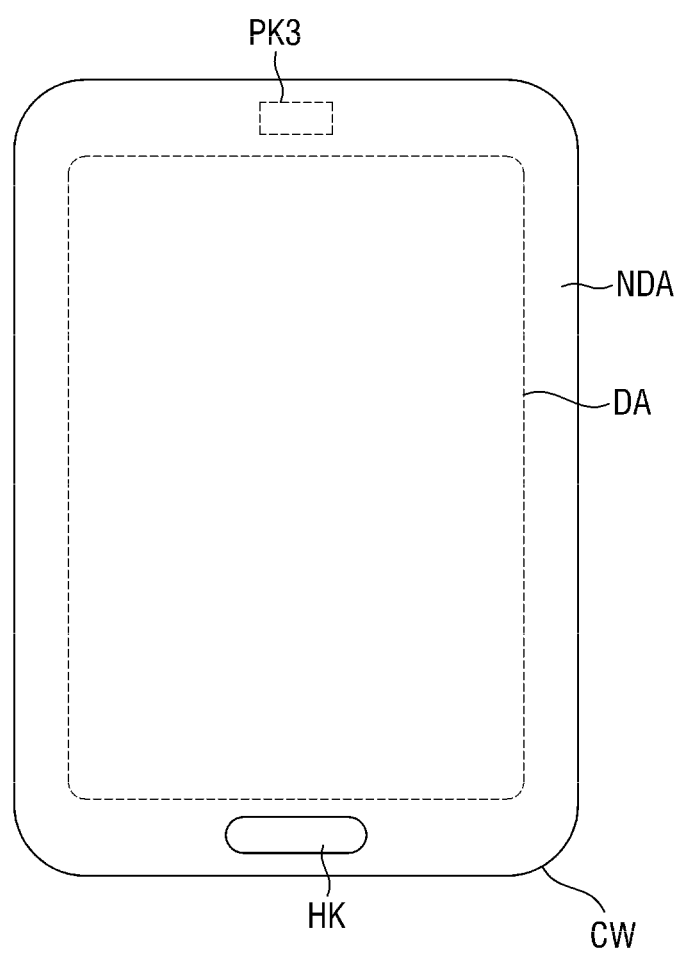
FIG. 6A is a plan view showing a layout of a display device according to an embodiment.

FIG. 6A is a plan view showing a layout of a display device according to an embodiment. The display device may include a home key HK and a third pressure key PK3.

The home key HK may be disposed on the cover window CW. The home key HK may be disposed in the non-display area NDA neighboring the display area DA. The home key HK may receive an input (e.g., a touch) from a user to cause the display device to perform necessary functions on the software.

The home key HK may be a button-type key which is physically (e.g., mechanically) implemented.

The home key HK may be a specific area on the cover window CW and may sense an input via a sensor or the like. The home key HK may be invisible from the outside of the display device.

The third pressure key PK3 and the home key HK may be respectively disposed at opposite sides relative to the display area DA. The home key HK may be disposed in the non-display area NDA under the display area DA, while the third pressure key PK3 may be disposed in the non-display area NDA above the display area DA.

The display area DA may be disposed between the home key HK and the third pressure key PK3.

The position of the pressure key may be configured according to embodiments. One or more pressure keys may be disposed at one or more of the upper, lower, left, and right sides of the display area DA.

The position(s) of the pressure key(s) may be configured for performing the necessary/corresponding function(s) and/or for optimizing user convenience.

Figure 6B:
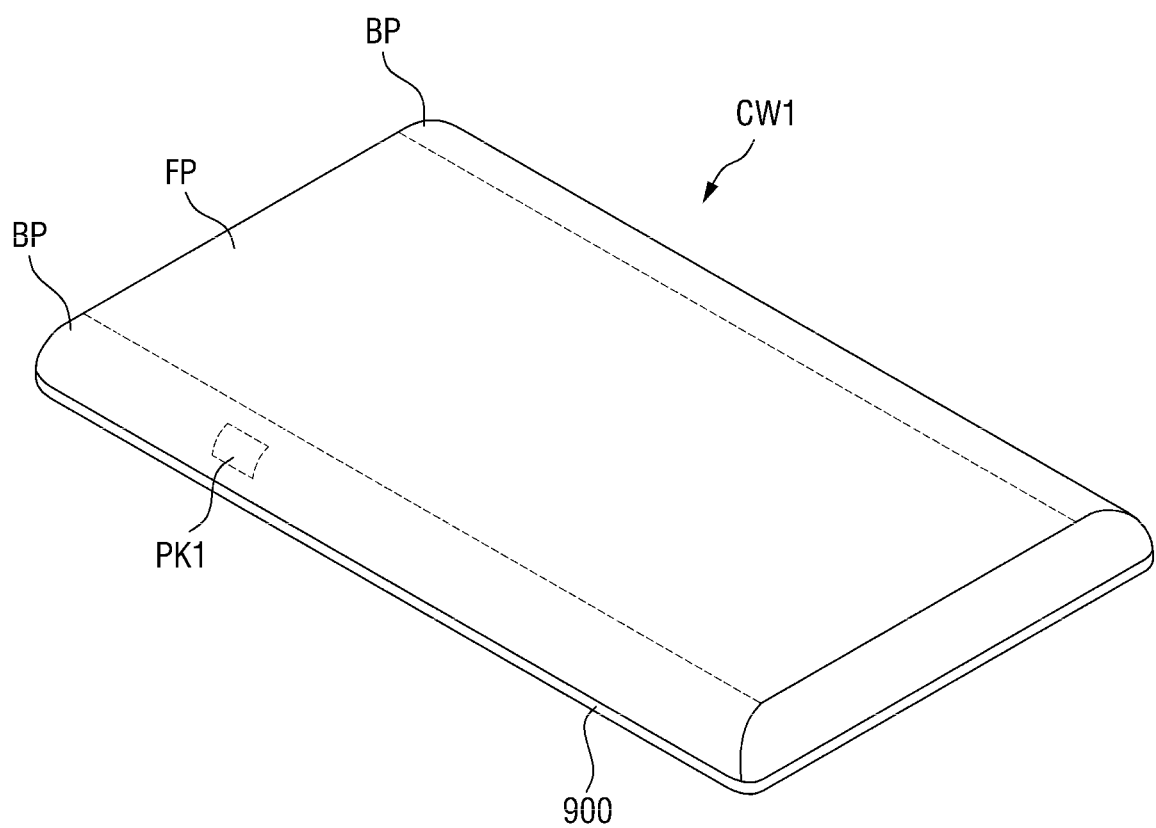
FIG. 6B is a perspective view of a display device according to an embodiment.

FIG. 6B is a perspective view of a display device according to an embodiment.

Referring to FIG. 6B, a cover window CW1 of a display device may include a flat portion FP and at least a bent portion BP (e.g., a curved portion) disposed on at least one side of the flat portion FP. The flat portion FP may have a flat upper surface. The upper surface may be disposed on a single plane.

At least one bent portion BP may be disposed on at least one side of the flat portion FP. Two bent portions BP are respectively disposed on two opposite sides of the flat portion FP in the example shown in FIG. 6B. One bent portion BP may be disposed on one side of the flat portion FP, or four bent portions BP may be disposed along the four sides of the flat portion FP.

The first pressure key PK1 may overlap the bent portion BP, such that a user can easily recognize the position of the first pressure key PK1. Advantageously, satisfactory user convenience can be attained.

Figure 7:
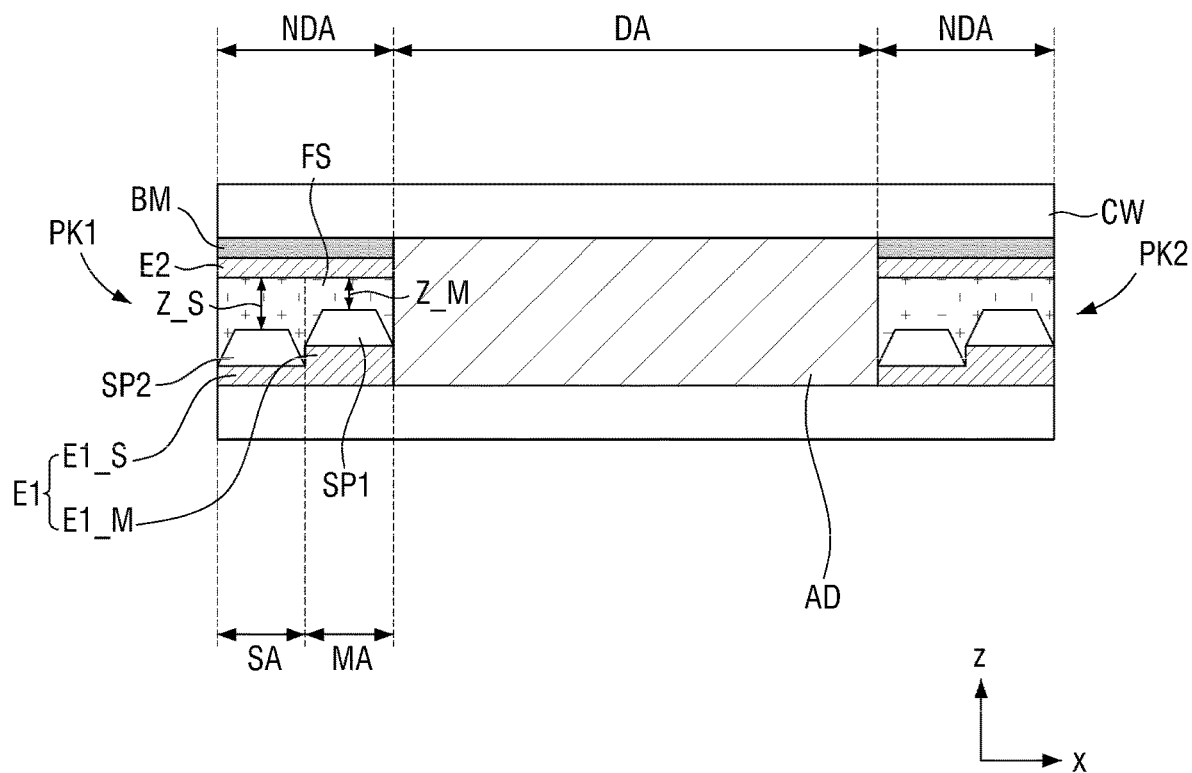
FIG. 7 is a cross-sectional view of a display device according to an embodiment.

FIG. 7 is a cross-sectional view of a display device according to an embodiment.

Referring to FIG. 7, the first electrode E1 may include a first sub-electrode E1_M and a second sub-electrode E1_S.

The first sub-electrode E1_M may be disposed in the first area MA, and the second sub-electrode E1_S may be disposed in the second area SA.

The height/thickness of the first sub-electrode E1_M may be unequal to the height/thickness of the second sub-electrode E2_M. The height of the first sub-electrode E1_M may be greater than the height of the second sub-electrode E2_M.

Referring to FIG. 7, the heights/thicknesses of the second electrode E2 and the light-blocking layer BM may be uniform from the first area MA to the second area SA.

The thickness of the first spacer SP1 may be equal to the thickness of the second spacer SP2.

The difference between the first minimum height Z_M and the second minimum height Z_S may result from the height difference between the first sub-electrode E1_M and the second sub-electrode E2_M.

Referring to FIG. 7, the first minimum height Z_M may be smaller than the second minimum height Z_S.

In this manner, the pressure key can sense pressure at multiple levels.

FIG. 8 is a cross-sectional view of a display device according to an embodiment. Referring to FIG. 8, a first thickness t1 of the first spacer SP1 may be unequal to a second thickness of the second spacer SP2. The first thickness t1 may be greater than the second thickness t2.

Referring to FIG. 8, each of the light-blocking layer BM, the first electrode E1, and the second electrode E2 may have a uniform thickness from the first area MA to the second area SA. The difference between the first minimum height Z_M and the second minimum height Z_S may result from the thickness difference between the first spacer SP1 and the second spacer SP2.

Referring to FIG. 8, the first minimum height Z_M may be smaller than the second minimum height Z_S.

In this manner, the pressure key can sense pressure at multiple levels.

Figure 9:
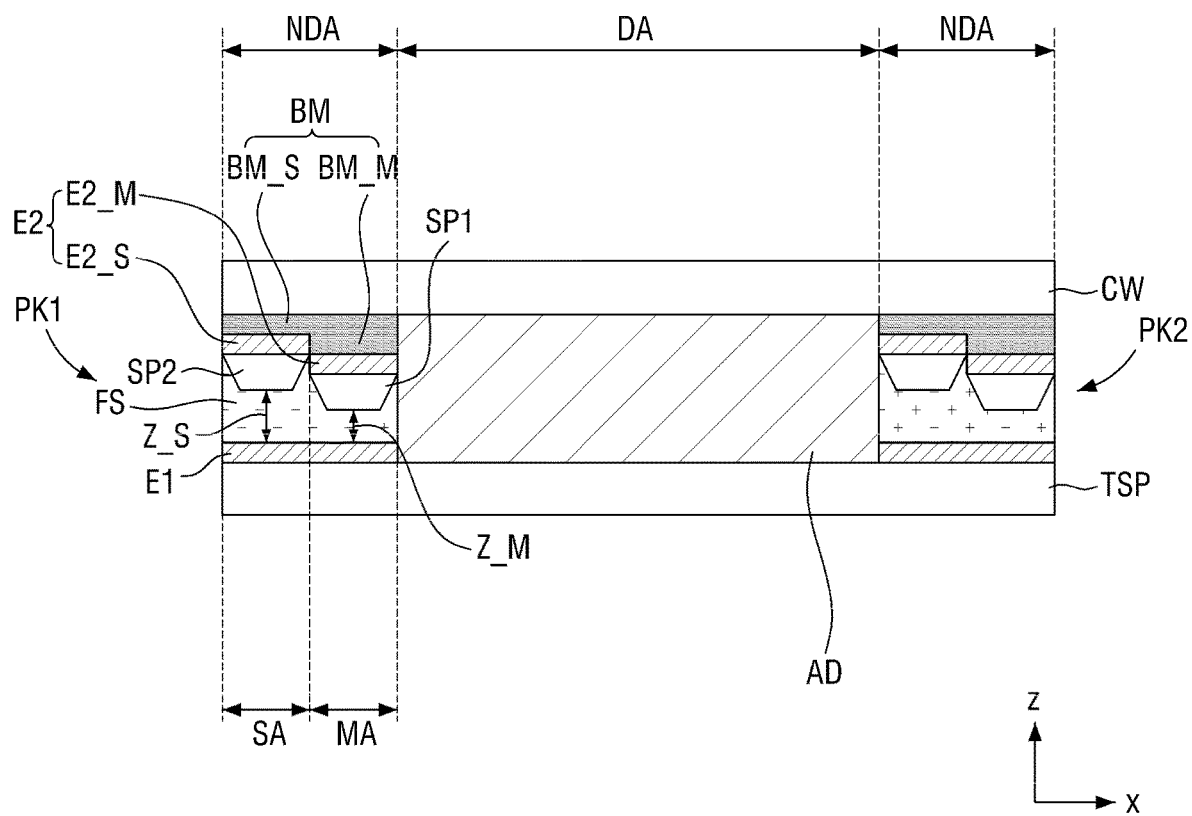
FIG. 9 is a cross-sectional view of a display device according to an embodiment.

FIG. 9 is a cross-sectional view of a display device according to an embodiment. The structure shown in FIG. 9 is substantially identical to and/or analogous to the structure shown in FIG. 2 except for the first spacer SP1 and the second spacer SP2.

The first spacer SP1 and the second spacer SP2 may extend/protrude from the second electrode E2 toward the first electrode E1.

Each of the first spacer SP1 and the second spacer SP2 may have an inverted trapezoid-shaped cross section.

In an embodiment, the first minimum height Z_M and the second minimum height Z_S may be the minimum distance between the first spacer SP1 and the first electrode E1 and the minimum distance between the second spacer SP2 and the first electrode E1, respectively. The first minimum height Z_M may be smaller than and the second minimum height Z_S.

Figure 10:
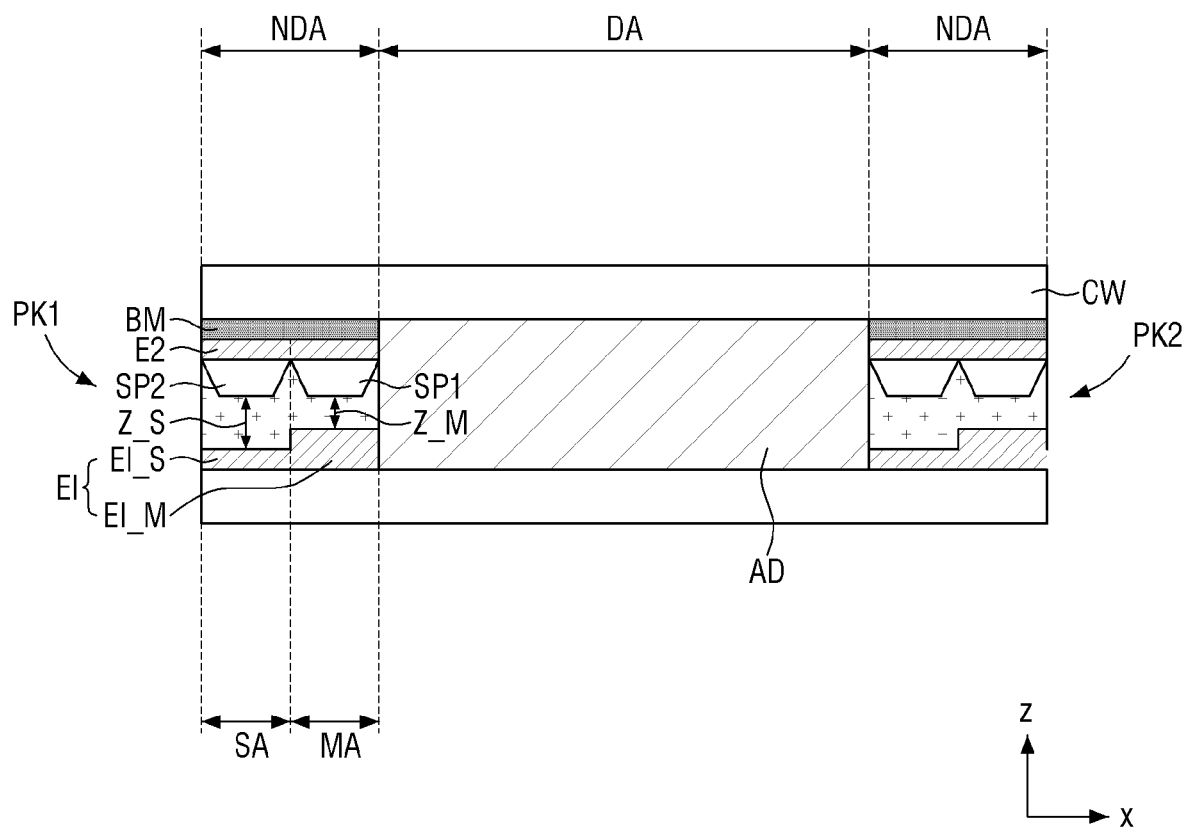
FIG. 10 is a cross-sectional view of a display device according to an embodiment.

FIG. 10 is a cross-sectional view of a display device according to an embodiment. The structure shown in FIG. 10 is substantially identical to and/or analogous to the structure shown in FIG. 7 except for the first spacer SP1 and the second spacer SP2.

The first spacer SP1 and the second spacer SP2 may extend/protrude from the second electrode E2 toward the first electrode E1.

Each of the first spacer SP1 and the second spacer SP2 may have an inverted trapezoid-shaped cross section.

The first minimum height Z_M and the second minimum height Z_S may be the minimum distance between the first spacer SP1 and the first electrode E1 and the minimum distance between the second spacer SP2 and the first electrode E1, respectively. The first minimum height Z_M may be smaller than and the second minimum height Z_S.

Figure 11:
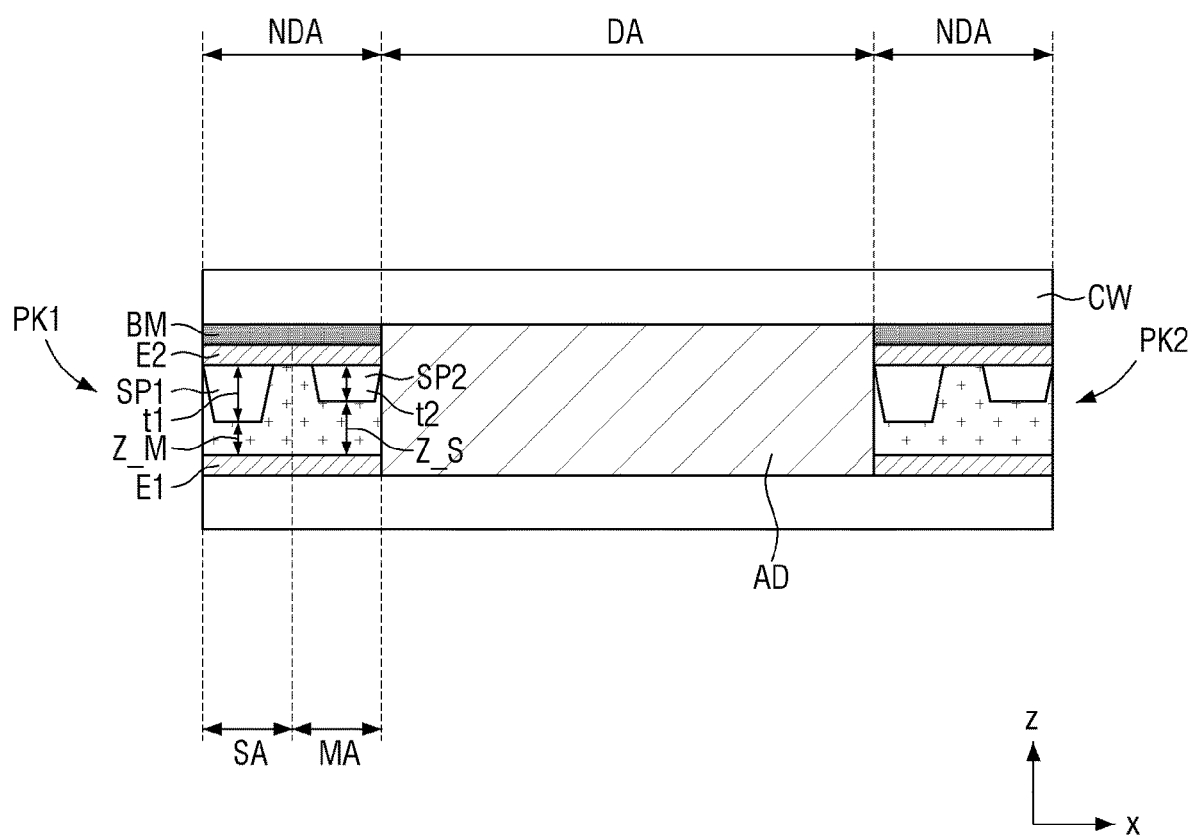
FIG. 11 is a cross-sectional view of a display device according to an embodiment.

FIG. 11 is a cross-sectional view of a display device according to an embodiment. The structure shown in FIG. 11 is substantially identical to and/or analogous to the structure shown in FIG. 8 except for the first spacer SP1 and the second spacer SP2.

The first spacer SP1 and the second spacer SP2 may be extend/protrude from the second electrode E2 toward the first electrode E1.

Each of the first spacer SP1 and the second spacer SP2 may have an inverted trapezoid-shaped cross section.

The first thickness t1 of the first spacer SP1 may be unequal to the second thickness t2 of the second spacer SP2. The first thickness t1 may be greater than the second thickness t2.

The first minimum height Z_M and the second minimum height Z_S may be the minimum distance between the first spacer SP1 and the first electrode E1 and the minimum distance between the second spacer SP2 and the first electrode E1, respectively. The first minimum height Z_M may be smaller than and the second minimum height Z_S.

In embodiments, the first minimum height Z_M and the second minimum height Z_S are made unequal by configuring a single element (e.g., the light-blocking layer or one of the electrodes). In embodiments, the first minimum height Z_M and the second minimum height Z_S may be made unequal by configuring two or more elements.

Figure 12:
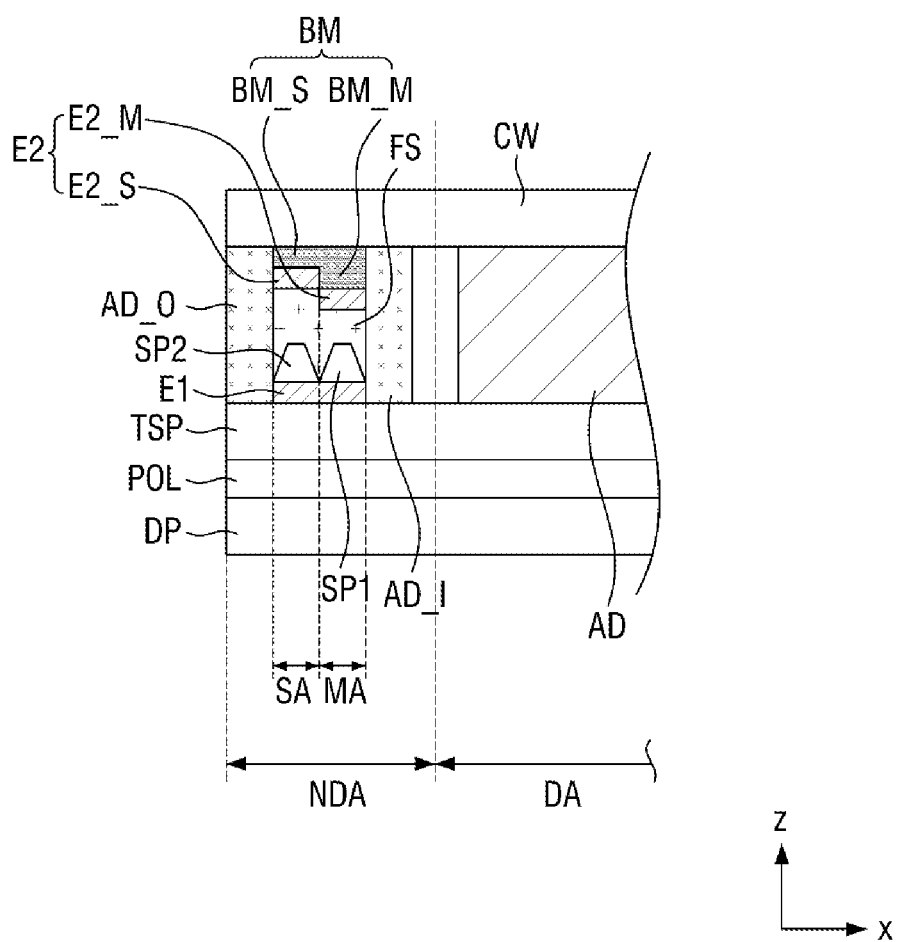
FIG. 12 is a cross-sectional view of a display device according to an embodiment.

FIG. 12 is a cross-sectional view of a display device according to an embodiment.

Referring to FIG. 12, a display device may include an inner adhesive layer AD_I and an outer adhesive layer AD_O.

Each of the inner adhesive layer AD_I and the outer adhesive layer AD_O may overlap the non-display area NDA.

The inner adhesive layer AD_I and the outer adhesive layer AD_O may be disposed at opposite sides of a first pressure key PK1. The first pressure key PK1 may be interposed between the outer adhesive layer AD_O and the inner adhesive layer AD_I.

The outer adhesive layer AD_O and the inner adhesive layer AD_I may firmly fix the first pressure key PK1 between the input sensing unit TSP and the cover window CW. The first pressure key PK1 can be stably fixed in the display device.

The configuration of the outer adhesive layer AD_O and the inner adhesive layer AD_I may be different from the configuration of the adhesive layer AD overlapping the display area DA. The thickness of the outer adhesive layer AD_O or the thickness of the inner adhesive layer AD_I may be equal to the thickness of the adhesive layer AD in the example shown in FIG. 12. In embodiments, the thickness of the outer adhesive layer AD_O or the thickness of the inner adhesive layer AD_I may be smaller than the thickness of the adhesive layer AD. At least one of the outer adhesive layer AD_O and the inner adhesive layer AD_I may be formed using a gasket tape having the thickness of 5 μm, and the adhesive layer AD overlapping the display area DA may be formed using a gasket tape having the thickness of 10 μm.

Figure 13:
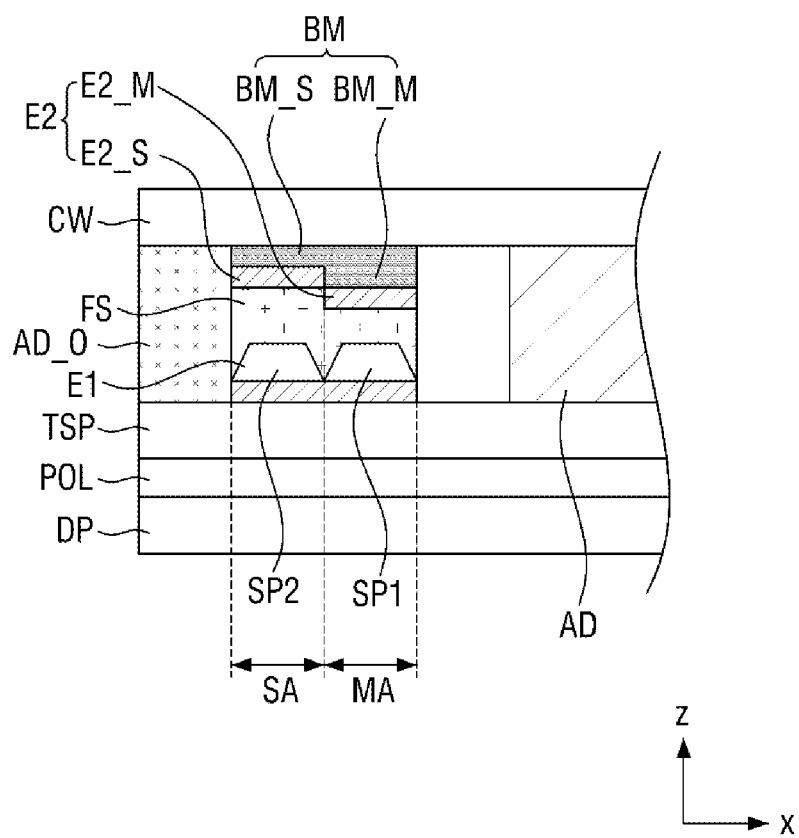
FIG. 13 is a cross-sectional view of a display device according to an embodiment.

FIG. 13 is a cross-sectional view of a display device according to an embodiment.

Referring to FIG. 13, the inner adhesive layer AD_I illustrated in FIG. 12 may be unnecessary. The first pressure key PK1 may be fixed by the outer adhesive layer AD_O. Since the adhesive layer AD is disposed in the display area DA, the first pressure key PK1 can be sufficiently stably fixed between the cover window CW and the input sensing unit TSP.

Figure 14:
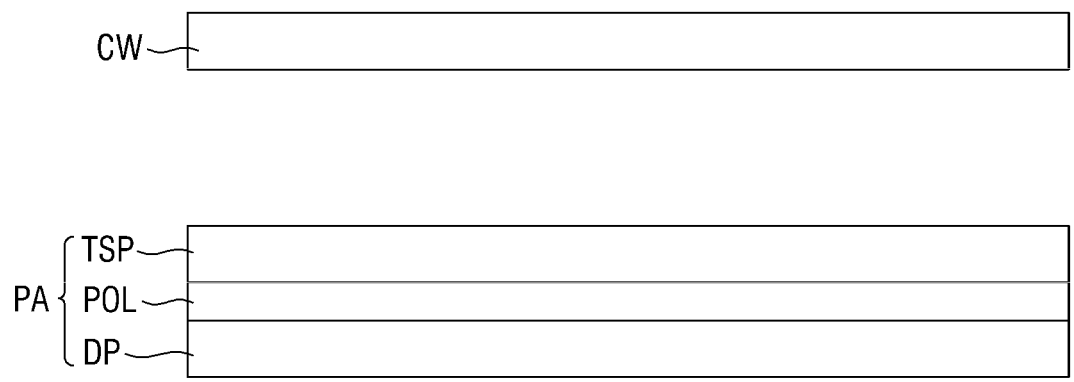
FIG. 14 is a cross-sectional view illustrating a structure formed in a method of fabricating a display device according to an embodiment.
Figure 15:
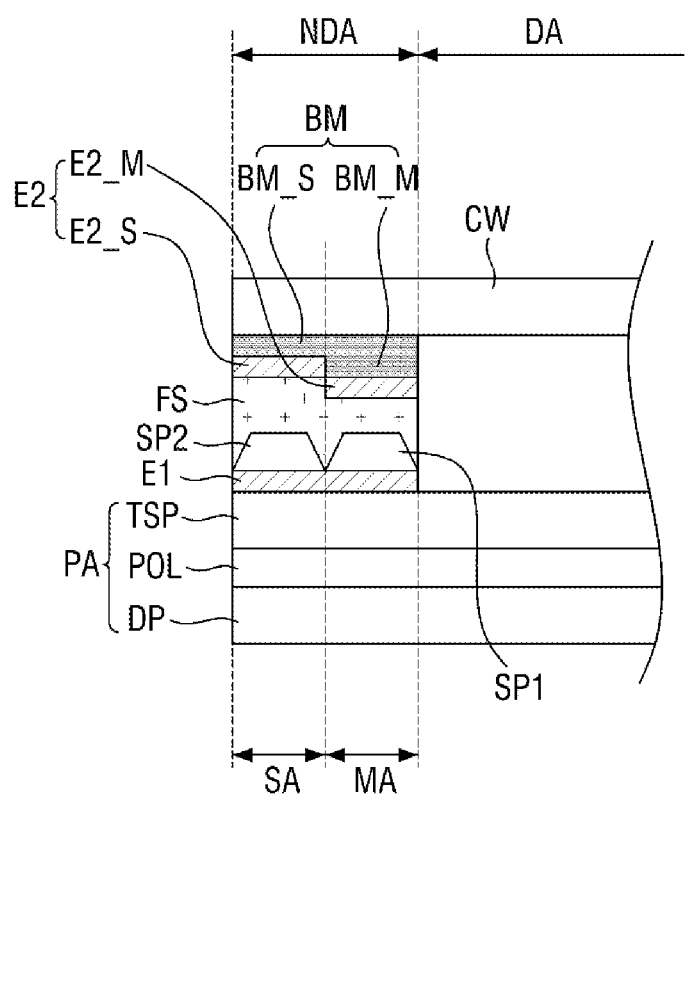
FIG. 15 is a cross-sectional view illustrating a structure formed in a method of fabricating a display device according to an embodiment.
Figure 16:
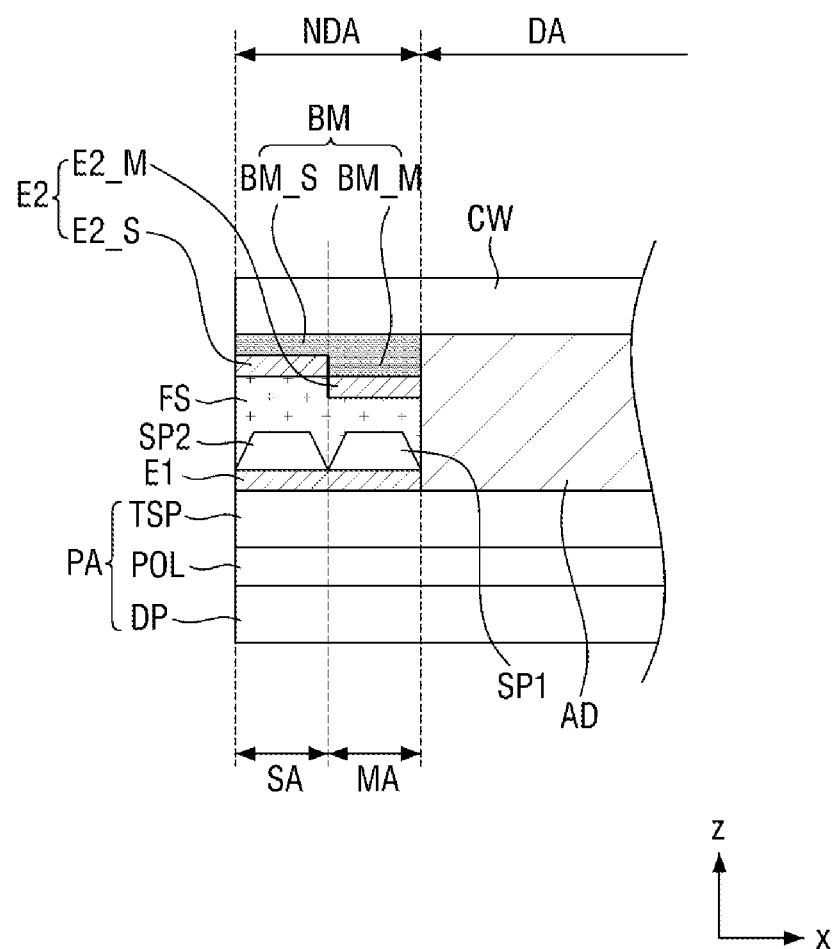
FIG. 16 is a cross-sectional view illustrating a structure formed in a method of fabricating a display device according to an embodiment.

FIG. 14 is a cross-sectional view illustrating a structure formed in a method of manufacturing a display device according to an embodiment. FIG. 15 is a cross-sectional view illustrating a structure formed in a method of manufacturing a display device according to an embodiment. FIG. 16 is a cross-sectional view illustrating a structure formed in a method of manufacturing a display device according to an embodiment. Elements of the display device may be identical to and/or analogous to elements described with reference to one or more of FIG. 1, FIG. 2, FIG. 3, FIG. 4, FIG. 5, FIG. 6, FIG. 7, FIG. 8, FIG. 9, FIG. 10, FIG. 11, FIG. 12, and FIG. 13.

The display panel DP, the polarization layer POL, and the input sensing unit TSP are substantially identical to and/or analogous to those described above.

A cover window CW may be disposed over a panel assembly PA.

Subsequently, referring to FIG. 15, a pressure key may be formed between the panel assembly PA and the cover window CW.

Elements of the pressure key may be substantially identical to or analogous to elements of one or more of the pressure keys (e.g., the first pressure key PK1, the second pressure key PK2, and/or the third pressure key PK3) described above.

The pressure key may include a first electrode E1, a second electrode E2, a pressure-sensitive material FS, a first spacer SP1, a second spacer SP2, and a light-blocking layer BM. Referring to, for example, FIG. 2, the first minimum height Z_M may be smaller than the second minimum height Z_S.

Referring to FIG. 16, the panel assembly PA may be attached to the cover window CW by an adhesive layer AD disposed between the panel assembly PA and the cover window CW. By interposing the adhesive layer AD between the panel assembly PA and the cover window CW and applying pressure, the panel assembly PA and the cover window CW can be securely attached together.

An inner adhesive layer AD_I and/or an outer adhesive layer AD_O may be additionally disposed, as illustrated in the structures of FIG. 12 and/or FIG. 13.

Although example embodiments have been disclosed for illustrative purposes, various modifications, additions, and substitutions are possible, without departing from the scope defined in the accompanying claims.

What is claimed is:

1. A display device comprising:
   a display panel comprising a display area and a non-display area neighboring each other in a first direction;
   an input sensing unit overlapping the display panel;
   a cover window overlapping the input sensing unit;
   a first electrode overlapping the non-display area and disposed between the cover window and the input sensing unit in a second direction different from the first direction;
   a second electrode overlapping the first electrode and disposed between the cover window and the first electrode;
   a pressure-sensitive member disposed between the first electrode and the second electrode;
   a first spacer disposed between the first electrode and the second electrode; and
   a second spacer disposed between the first electrode and the second electrode,
   wherein the first spacer and the second spacer neighbor each other in the first direction,
   wherein a first minimum thickness of the pressure-sensitive member in the second direction corresponds to the first spacer, wherein a second minimum thickness of the pressure-sensitive member in the second direction corresponds to the second spacer, and wherein the first minimum thickness of the pressure-sensitive member is unequal to the second minimum thickness of the pressure-sensitive member.

2. The display device of claim 1, wherein the first minimum thickness of the pressure-sensitive member is positioned closer to the display area than the second minimum thickness of the pressure-sensitive member and is smaller than the second minimum thickness of the pressure-sensitive member.

3. The display device of claim 1, further comprising: a light-blocking layer disposed between the cover window and the second electrode, wherein the light-blocking layer comprises a first constituent light-blocking layer overlapping the first spacer and comprises a second constituent light-blocking layer overlapping the second spacer, and wherein a thickness of the first constituent light-blocking layer in the second direction is unequal to a thickness of the second constituent light-blocking layer in the second direction.

4. The display device of claim 3, wherein the second electrode comprises a first sub-electrode disposed on the first constituent light-blocking layer and comprises a second sub-electrode disposed on the second constituent light-blocking layer, and wherein a distance from the first sub-electrode to the display panel is unequal to a distance from the second sub-electrode to the display panel.

5. The display device of claim 1, wherein the second electrode comprises a first sub-electrode overlapping the first spacer and comprises a second sub-electrode overlapping the second spacer, and wherein a thickness of the first sub-electrode in the second direction is different from a thickness of the second sub-electrode in the second direction.

6. The display device of claim 1, wherein the first spacer and the second spacer directly contact the first electrode and are spaced from the second electrode.

7. The display device of claim 1, wherein the pressure-sensitive member comprises a plurality of conductive particles.

8. The display device of claim 1, further comprising: a touch printed circuit board electrically connected to the input sensing unit; and a touch integrated circuit disposed on the touch printed circuit board, wherein the second electrode is electrically connected to the touch integrated circuit.

9. The display device of claim 1, wherein the cover window comprises a flat portion and a bent portion connected to at least one side of the flat portion, and wherein the pressure-sensitive member overlaps the bent portion.

10. The display device of claim 1, wherein a thickness of the first spacer in the second direction is unequal to a thickness of the second spacer in the second direction.

11. The display device of claim 1, wherein the first electrode comprises a first sub-electrode overlapping the first spacer and comprises a second sub-electrode overlapping the second spacer, and wherein a height of the first sub-electrode with reference to the display panel is unequal to a height of the second sub-electrode with reference to the display panel.

12. The display device of claim 1, wherein the first spacer and the second spacer directly contact the second electrode and protrude toward the first electrode.

13. The display device of claim 1, further comprising: a ground electrode disposed on the input sensing unit.

14. The display device of claim 13, further comprising: a pressure printed circuit board electrically connected to the second electrode, wherein the second electrode is connected to the touch integrated circuit through the pressure printed circuit board and the touch printed circuit board.

15. The display device of claim 13, wherein the ground electrode is electrically connected to the first electrode.

16. The display device of claim 13, wherein the ground electrode is integral with the first electrode and is made of a same material as the first electrode.

17. The display device of claim 1, further comprising: a home key disposed on the cover window for receiving a user input, wherein the display area is disposed between the pressure-sensitive member and the home key.

18. The display device of claim 1, further comprising: an outer adhesive layer overlapping the non-display area and disposed farther from the display area than the pressure-sensitive member.

19. The display device of claim 18, further comprising: an inner adhesive layer, wherein the pressure-sensitive member is disposed between the inner adhesive layer and the outer adhesive layer.

20. A method for manufacturing a display device, the method comprising:

preparing a panel assembly comprising a display area and a non-display area neighboring each other in a first direction;

preparing a cover window over the panel assembly;

providing a first electrode overlapping the non-display area between the cover window and the panel assembly, the first electrode overlapping the non-display area in a second direction different from the first direction;

providing a second electrode between the cover window and the first electrode;

providing a pressure-sensitive member between the first electrode and the second electrode;

providing a first spacer between the first electrode and the second electrode; and providing a second spacer between the first electrode and the second electrode, wherein the first spacer and the second spacer neighbor each other in the first direction, wherein a first minimum thickness of the pressure-sensitive member in the second direction corresponds to the first spacer, wherein a second minimum thickness of the pressure-sensitive member in the second direction corresponds to the second spacer, and wherein the first minimum thickness of the pressure-sensitive member is unequal to the second minimum thickness of the pressure-sensitive member.

* * * * *